(12) United States Patent
Iriguchi

(10) Patent No.: US 7,670,949 B2
(45) Date of Patent: Mar. 2, 2010

(54) SEMICONDUCTOR DEVICE AND METHOD OF MANUFACTURING SEMICONDUCTOR DEVICE

(75) Inventor: Chiharu Iriguchi, Suwa (JP)

(73) Assignee: Seiko Epson Corporation, Tokyo (JP)

(*) Notice: Subject to any disclaimer, the term of this patent is extended or adjusted under 35 U.S.C. 154(b) by 292 days.

(21) Appl. No.: 11/690,527

(22) Filed: Mar. 23, 2007

(65) Prior Publication Data
US 2007/0224835 A1   Sep. 27, 2007

(30) Foreign Application Priority Data
Mar. 27, 2006   (JP)   ............................. 2006-084936

(51) Int. Cl.
*H01L 21/4763* (2006.01)
(52) U.S. Cl. ..................... 438/640; 438/942; 438/945; 438/946; 257/774
(58) Field of Classification Search ................ 438/640, 438/942, 945, 946; 257/774
See application file for complete search history.

(56) References Cited

U.S. PATENT DOCUMENTS

| | | | | |
|---|---|---|---|---|
| 4,814,041 A | * | 3/1989 | Auda | 438/712 |
| 4,902,377 A | * | 2/1990 | Berglund et al. | 438/640 |
| 7,081,408 B2 | * | 7/2006 | Lane et al. | 438/637 |
| 7,238,609 B2 | * | 7/2007 | Ito | 438/640 |
| 2005/0101136 A1 | | 5/2005 | Mori | |
| 2006/0148245 A1 | * | 7/2006 | Kim | 438/640 |

FOREIGN PATENT DOCUMENTS

| | | |
|---|---|---|
| JP | A-03-166720 | 7/1991 |
| JP | A-04-293230 | 10/1992 |
| JP | A-08-031714 | 2/1996 |
| JP | A 2003-297718 | 10/2003 |
| JP | A-2005-077955 | 3/2005 |
| JP | A-2005-277284 | 10/2005 |

OTHER PUBLICATIONS

Francis Clube et al., "0.5μm Enabling Lithography for Low-Temperature Polysilicon Displays," Society of Information Display, 2003 International Symposium, Digest of Technical Papers, vol. XXXIV, book I, pp. 350-353.

* cited by examiner

*Primary Examiner*—Zandra Smith
*Assistant Examiner*—Christy L Novacek
(74) *Attorney, Agent, or Firm*—Oliff & Berridge, PLC

(57) ABSTRACT

A method of manufacturing a semiconductor device includes: forming a first photosensitive material pattern having an opening hole on a work target layer formed on an active surface of a substrate; performing a first etching by performing an etching treatment to the work target layer using the first photosensitive material pattern as a mask, and forming one of a concave and a groove in a tapered shape with a wide opening to the work target layer while enlarging the opening hole, by performing the etching treatment so as to enlarge the opening hole; and filling a metal film into one of the concave and the groove.

11 Claims, 5 Drawing Sheets

SEMICONDUCTOR DEVICE AND METHOD OF MANUFACTURING SEMICONDUCTOR DEVICE

BACKGROUND

1. Technical Field

Several aspects of the present invention relate to a semiconductor device and a method of manufacturing a semiconductor device, and more particularly to a technology to manufacture a microscopic hole and a groove on a substrate.

2. Related Art

The above-mentioned method for manufacturing the semiconductor device, for example, forms an insulating film on a substrate, and forms a contact hole to the insulating film in order to electrically connect wirings. In recent years, forming a microscopic contact hole on a relatively large substrate has been sought-after. For example, a non-patent document F. Clube et al., 0.5 µm Enabling Lithography for Low-temperature Polysilicon Displays, Society for Information Display, 2003 International Symposium, Digest of Technical Papers, volume XXXIV, book I, pp. 350-353 discloses that it is possible to form a microscopic contact hole to a large substrate by using hologram exposure technology, since it forms a high-resolution pattern.

However, the microscopic contact hole has a large aspect ratio (elongated contact hole). When a metal material is filled into the contact hole, it is difficult to fill the metal material deep into the contact hole. This problem leads to a poor coverage of the metal material and deteriorates electrical characteristics, causing a connection failure and a disconnection of wiring.

In order to improve the coverage, for example, an opening of the contact hole is enlarged for easy filling. The opening is enlarged by immersing a substrate formed with the contact hole in an etching solution. An insulating film at the opening of the contact hole is removed by this method. By enlarging the opening in such a way, filling the metal material into the contact hole can be performed with ease, thereby improving the coverage.

However, as the substrate is large, etching time differs from one end of the substrate to the other end of the substrate, when the substrate is immersed in and out of the etching solution. This results in a difference in etching quantity at the opening of the contact hole. Therefore, variations occur, such as one with wide opening and one with little etching. When the metal material is filled into the contact hole, it is difficult to fill the metal material deep into the contact hole. This problem causes a difference in the coverage, allowing variations in the electrical characteristics, and leading to a problem of generating some without electrical continuity.

SUMMARY

An advantage of the invention is to provide a semiconductor device and a method for manufacturing a semiconductor device to improve coverage when a metal material is filled into a hole and a groove.

In order to solve the above problems, according to a first aspect of the invention, a method for manufacturing a semiconductor device includes: forming a first photoresist pattern having an opening hole on a work target layer formed on an active surface of a substrate; performing a first etching by performing an etching treatment to the work target layer using the first photoresist pattern as a mask and forming a concave or a groove in a tapered shape with a wide opening to the work target layer while enlarging the opening hole by performing the etching treatment so as to enlarge the opening hole, and filling a metal film into the concave or the groove.

According to the aspect, as the opening of the concave or the groove formed to the work target layer is enlarged by forming the first photoresist pattern, filling the metal film into the concave or the groove becomes easy. Therefore, the entire inside of the concave or the groove may be filled with the metal film, enabling to improve the coverage of the metal film. As a result, stable electrical characteristics can be obtained.

According to the aspect, in the method for manufacturing the semiconductor device, the opening hole of the first photoresist pattern may be formed in a tapered shape with an exposed side being wide. And the first etching performs an anisotropic etching to the first photoresist pattern and the work target layer.

According to the aspect, as the hole of the photoresist pattern is in a tapered shape enlarging towards the exposed side, the etching treatment may be performed to the work target layer while enlarging the opening hole by anisotropically etching the photoresist pattern. This enables to form the concave or the groove in a tapered shape with a wide opening to the work target layer. Therefore, as the opening of the concave or the groove is wide, the metal film can be filled into the concave or the groove with ease. The entire inside of the concave or the groove may be filled with the metal film, enabling to improve the coverage of the metal film. As a result, stable electrical characteristics can be obtained.

According to a second aspect of the invention, the method for manufacturing the semiconductor device further includes: forming a second photoresist pattern having the opening hole in a tapered shape being enlarged by performing the anisotropic etching treatment to the first photoresist pattern, after the first etching. Also, the aspect includes performing a second etching by performing the anisotropic etching treatment to the work target layer using the second photoresist pattern as a mask, and forming a two-stage concave or groove with a wide opening to the work target layer by performing the anisotropic etching treatment to the second photoresist pattern, after forming the second photoresist pattern.

According to the aspect, as the opening hole in a tapered shape is further enlarged by forming the second photoresist pattern, the concave or the groove formed previously by the second etching further progresses. Also, it may be formed by adding a large concave or groove being etched using the second photoresist pattern as a mask. This enables to form the two-stage concave or groove, enlarging the opening of the concave or the groove. As the aspect ratio of the concave or the groove can be reduced, and the opening is enlarged, the entire inside of the two-stage concave or groove may be filled with the metal material. As a result, the coverage of the metal film can be improved.

According to the aspect, the method for manufacturing the semiconductor device may include the first photoresist pattern having the opening hole formed by exposing a photoresist film being a base for the first photoresist pattern, using a holographic exposure device.

According to the aspect, the photoresist film is exposed by the holographic exposure device. As it is exposed by adjusting focus to a surface of the photoresist film, a microscopic opening hole may be formed to the photoresist film even if the substrate is rough. Therefore, it is possible to form the microscopic concave or the groove to the work target layer, even the substrate is relatively large.

According to the aspect, the method for manufacturing the semiconductor device may include the photoresist film made of a low transmittance material. And the opening hole in a tapered shape with the exposed side being wide is formed by exposing the photoresist film.

According to the aspect, the photoresist film having a low transmittance is being used. Therefore, a degree of light sensitivity can be reduced towards the lower side of the photoresist film, when the photoresist film is exposed. This enables to form an exposed area which becomes wider as it get closer to the exposed side. Therefore, by developing in the continuous steps, the opening hole in a tapered shape with the exposed side being wide can be formed to the photoresist film. As a result, it is possible to form the first photoresist pattern having the opening hole in a tapered shape.

According to the aspect, the method for manufacturing the semiconductor device may include the photoresist film made of a low contrast material. And the opening hole in a tapered shape with the exposed side being wide is formed by exposing the photoresist film.

According to the aspect, it is possible to form the exposed area which becomes wider as it gets closer to the exposed side. Therefore, by developing in the continuous steps, the opening hole in a tapered shape with the exposed side being wide can be formed to the photoresist film. As a result, it is possible to from the first photoresist pattern having the opening hole in a tapered shaped.

According to the aspect, the method for manufacturing the semiconductor device may include the concave or the groove which is one of a contact hole, a via-hole or a wiring groove.

According to the aspect, if the contact hole is in a tapered shape with a wide opening, it is possible to electrically connect a semiconductor element and a wiring in a stable manner by filling the metal material. If it is the via-hole, it is possible to electrically connect wirings in a stable manner. If it is the wiring groove, it is possible to electrically connect the wiring and the target to be connected in a stable manner, for example.

According to an fourth aspect of the invention, a semiconductor device includes a concave or a groove in a tapered shape with a wide opening, formed to a work target layer on an active surface of a substrate, by performing an anisotropic etching to the work target layer and a first photoresist pattern, using the first photoresist pattern having an opening hole in a tapered shape with an exposed side being wide, and a metal film filled into the concave or the groove in a tapered shape.

According to the aspect, the concave or the groove is formed into a tapered shape with a wide opening, as the work target layer is being etched by retreating an edge of the opening hole in a tapered shape (while enlarging the opening hole), by performing the anisotropic etching to the first photoresist pattern and the work target layer. This enables to fill the entire inside of the concave or the groove with the metal film, improving the coverage of the metal film. As a result, the semiconductor device which can obtain stable electrical characteristics can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of a method for manufacturing a semiconductor device and a semiconductor device according to the present invention will now be described with reference to the drawings.

Figure 1:
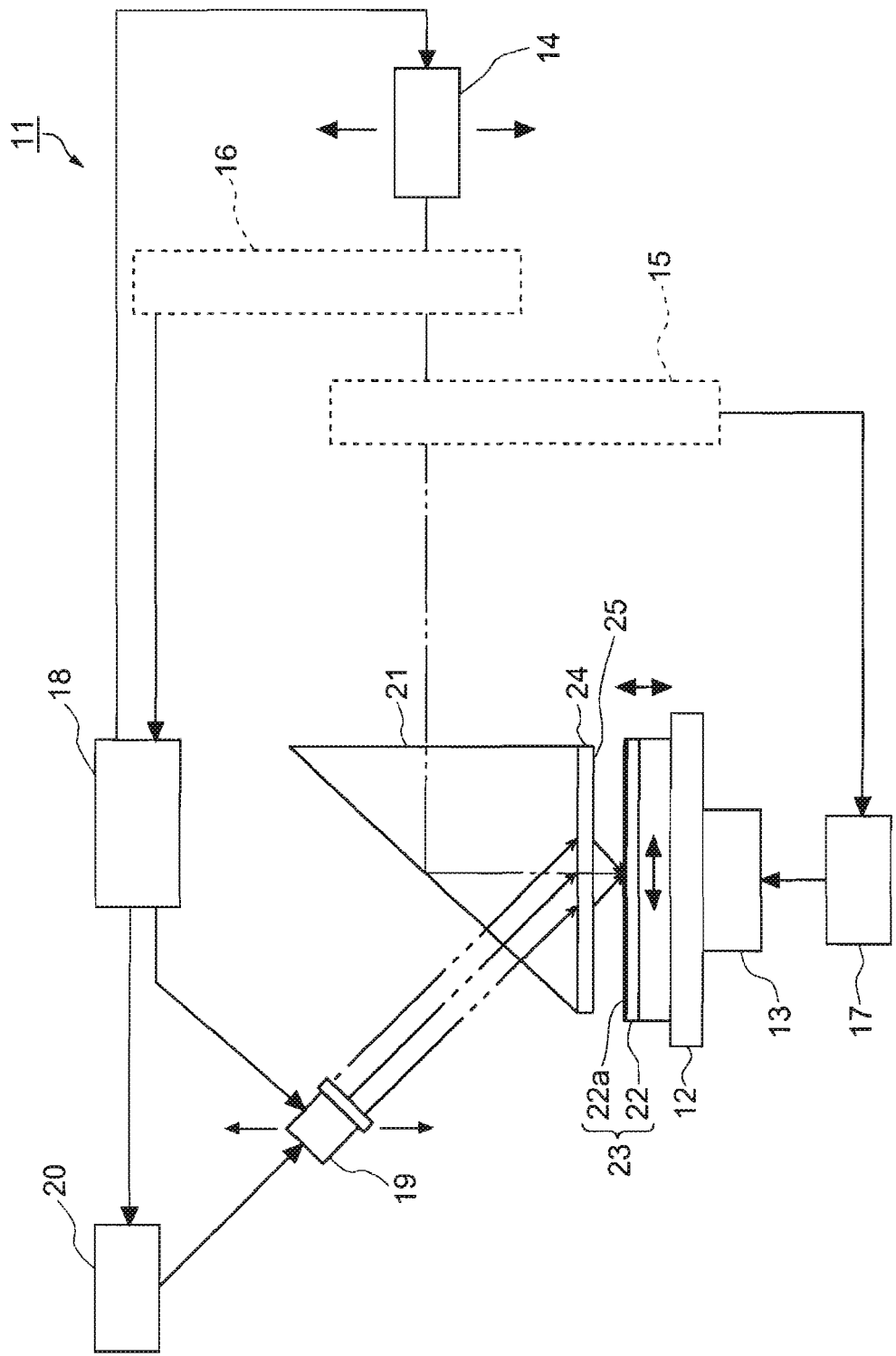
FIG. 1 is a diagram schematically showing a configuration of a holographic exposure device according to an embodiment.

FIG. 1 is a diagram schematically showing a configuration of a holographic exposure device used in an exposing step for manufacturing a semiconductor device. Hereinafter, the configuration of the holographic exposure device is to be described with reference to FIG. 1.

Referring to FIG. 1, a holographic exposure device 11 has a stage device 13 including a stage 12, a light source 14, a distance measuring optical system 15, a thickness measuring optical system 16, a first information processing device 17, a second information processing device 18, an exposure light source 19, an exposure light source drive device 20 and a prism 21.

The stage device 13 is configured to hold a workpiece 23 formed with a photoresist film 22 on the stage 12 with a vacuum chuck and the like. The stage 12 is provided so as to be movable in a horizontal direction (XY direction) and a vertical direction (Z direction), to adjust a position of the workpiece 23.

The light source 14 is configured so that a measuring light beam of the distance measuring optical system 15 and the thickness measuring optical system 16 is to be emitted. The distance measuring optical system 15 and the first information processing device 17 are hereinafter described in detail.

The thickness measuring optical system 16 includes a beam splitter 31 (see FIG. 2), a photodetector, an amplifier, an A/D converter and the like, and includes a feature to measure a thickness of the photoresist film 22 formed at the workpiece 23.

The second information processing device 18 performs a process of moving the exposure light source 19 so as an exposure light beam 56 (see FIG. 3) emitted from the exposure light source 19 scans within an appropriate exposure area. It also performs a process of controlling an amount of exposure light based on a relative value of the thickness of the photoresist film 22 being output from the thickness measuring optical system 16.

The exposure light source 19 is configured to irradiate the exposure light beam 56 to a hologram recording surface 25 of a hologram mask 24.

The exposure light source drive device 20 is configured to expose by scanning a desired exposure area on the workpiece 23 by moving the exposure light source 19. The holographic exposure device 11 includes the prism 21 mounted with the hologram mask 24 which an interference pattern corresponding to a predetermined reticle pattern is recorded to a counter surface of the workpiece 23.

Figure 2:
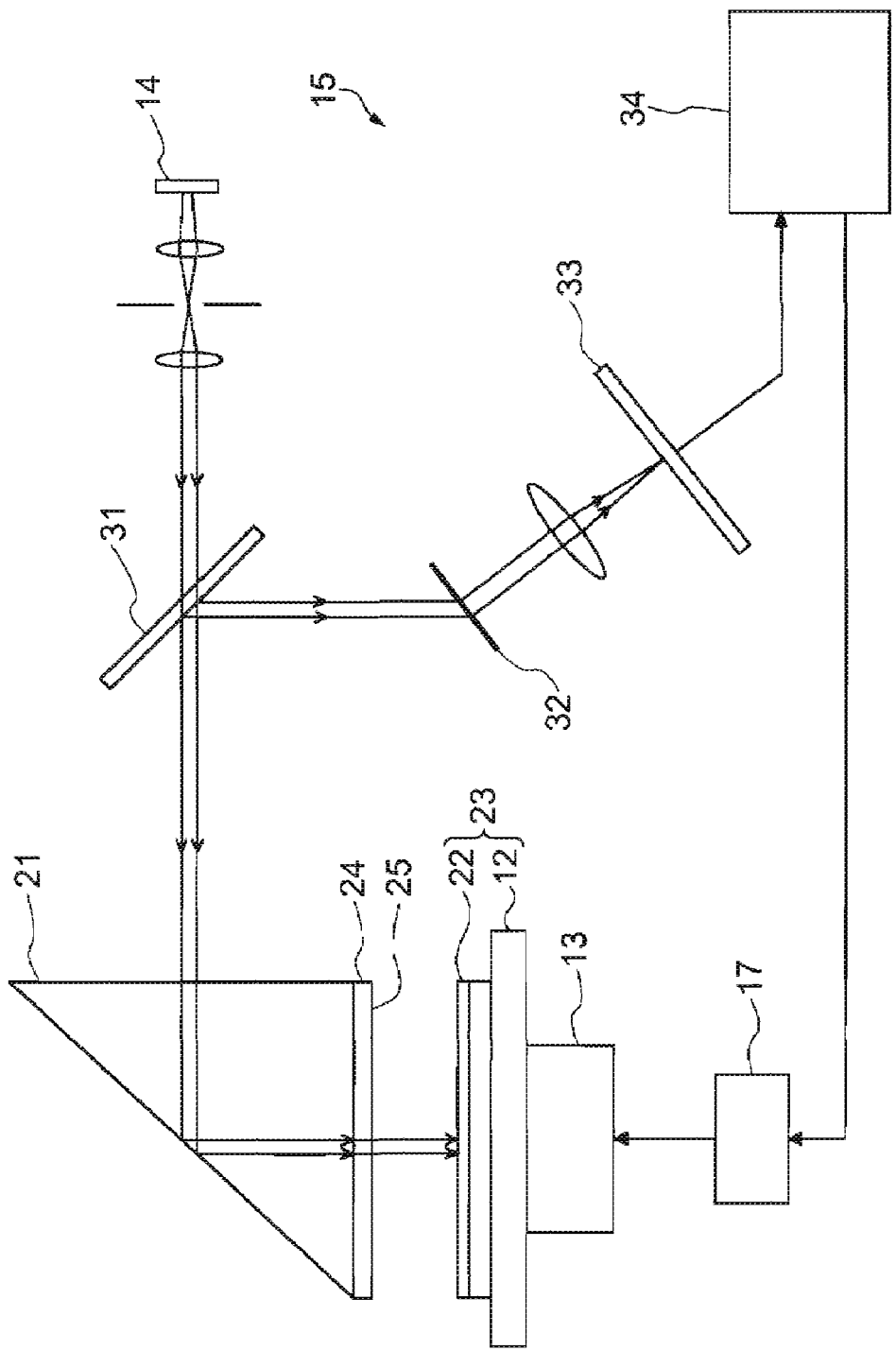
FIG. 2 is a diagram schematically showing a configuration of a distance measuring optical system according to the holographic exposure device.

FIG. 2 is a diagram schematically showing a configuration of a distance measuring optical system. Hereinafter, the configuration of the distance measuring optical system is to be described with reference to FIG. 2.

Referring to FIG. 2, the distance measuring optical system 15 has the beam splitter 31, a diffraction grating 32, a linear charge-coupled device (CCD) array 33 as an optical sensor, and an error signal detector 34. An exposure method using the distance measuring optical system 15 is hereinafter described.

A focus beam for focus adjustment is emitted to the workpiece 23 from the light source 14. A wavelength of the focus beam is 800 to 900 nm, for example. The focus beam reflects on the hologram mask 24 and the workpiece 23 via the prism 21. The reflected light having different wavelengths reflected at the hologram mask 24 and the workpiece 23 is guided to the diffraction grating 32 via the beam splitter 31, respectively. The reflected light is then dispersed by the diffraction grating 32 and focused on the linear CCD array 33.

By an interference wave of the reflected light of the hologram mask 24 and the workpiece 23, an intensity distribution changes when passing through the CCD. The change of the intensity distribution obtained by the linear CCD array 33 is detected by the error signal detector 34, and a distance between the hologram mask 24 and the workpiece 23 is calculated. The calculated error information is then transmitted to the first information processing device 17.

At the first information processing device 17, based on a distance between the hologram recording surface 25 and a surface 22a of the photoresist film 22 formed at the workpiece 23 (see FIG. 1), which is measured by the distance measuring optical system 15, positioning information for setting a position of the stage 12 is transmitted to the stage device 13 so that a proper focus is achieved.

The stage device 13 adjusts the position of the stage 12 in the vertical direction (Z direction) based on the positioning information for setting the position of the stage 12. A distance between the hologram recording surface 25 and the surface of the photoresist film 22 formed on the workpiece 23 can be adjusted by such a mechanism, thereby enabling highly accurate exposure.

FIGS. 3 through 10 are sectional views schematically showing the method for manufacturing the semiconductor device. Hereinafter, the method for manufacturing the semiconductor device is to be described with reference to FIGS. 3 through 10. In the present embodiment, a method for manufacturing a wiring layer of the semiconductor device is to be described in particular.

Figure 3:
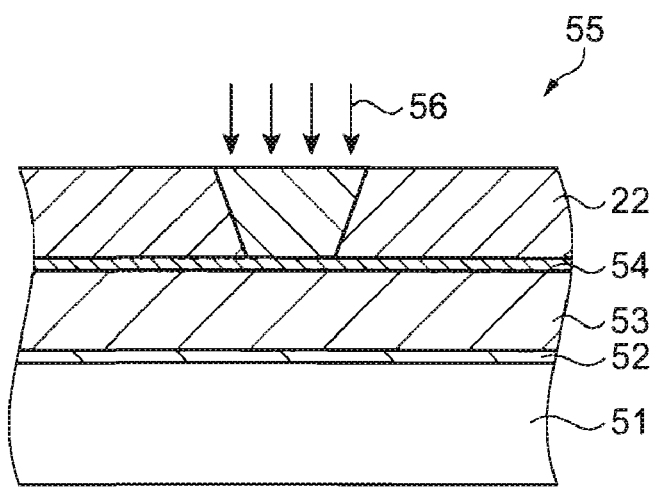
FIG. 3 is a sectional view schematically showing a method for manufacturing a semiconductor device.

In a step shown in FIG. 3, the photoresist film 22 is to be exposed. First, a semiconductor substrate 55 is to be provided. The semiconductor substrate 55 is formed by sequentially depositing a polysilicon (p-Si) layer 52, a silicon oxide film ($SiO_2$) 53 as a work target layer, a titanium nitride film (TiN) 54 as a reflecting film and the photoresist film 22 on a substrate 51 (on an active surface) such as glass. A thickness of the polysilicon layer 52 is 50 nm, for example. A thickness of the silicon oxide film 53 is 800 nm, for example. A thickness of the titanium nitride film 54 is 50 nm, for example. And a thickness of the photoresist film 22 is 1 µm, for example.

More specifically, the polysilicon layer 52 may be an active layer such as a thin film transistor. And the polysilicon layer 52 may be formed by various film formation methods, such as a plasma enhanced chemical vapor deposition (PECVD) method, a low pressure chemical vapor deposition (LPCVD) method and a sputtering method, for example. The silicon oxide film 53 may be formed by a film formation method such as an electron cyclotron resonance PECVD (ECR-CVD) method or the PECVD method, for example. The titanium nitride film 54 may be formed by a film formation method such as the sputtering method and a chemical vapor deposition (CVD) method, for example. An underlying insulating layer such as a silicon oxide film, which is not shown, may be formed between the substrate 51 and the polysilicon layer 52.

Next, the photoresist film 22 is to be exposed. The exposure light beam 56 is irradiated to the photoresist film 22 from the exposure light source 19 of the holographic exposure device 11 (see FIG. 1). An area, for example, forming a contact hole 71 as one of the concaves (see FIG. 7), which is irradiated by the exposure light beam 56, is photosensitized by this. In order to perform focus control of the exposure light beam 56, the above-mentioned focus beam for focus adjustment is to be irradiated to the photoresist film 22, at the same time. By forming the titanium nitride film 54 which has higher reflectivity than the silicon oxide film 53 on the silicon oxide film 53, an amount of reflected light that is required for the focus adjustment can be obtained, for example, even if the silicon oxide film 53 having a high optical transparency is formed.

The photoresist film 22 uses a material which has a photosensitive characteristic with low transmittance (low sensitivity), such as a novolac resin system. By using such a material, the intensity of the exposure light beam 56 irradiated to the photoresist film 22 may be reflected when the photoresist film 22 is exposed. For example, the intensity of the exposure light beam 56 at a periphery of the exposed area (periphery of an opening hole at the mask) is relatively weak. And the intensity of the exposure light beam 56 at a center of the exposed area (center of the opening hole at the mask) is relatively strong. This enables to form a tapered area which an exposed side is widely exposed, as shown in FIG. 3. As a result, an opening hole 62a in a tapered shape (see FIG. 4) which the intensity of light is reflected to its shape can be formed, when developing is performed in continuous steps. A low contrast (less steep photosensitive characteristics) material may be used for the photoresist film 22. This may also reflect the intensity of the exposure light beam 56 irradiated to the photoresist film 22.

Figure 4:
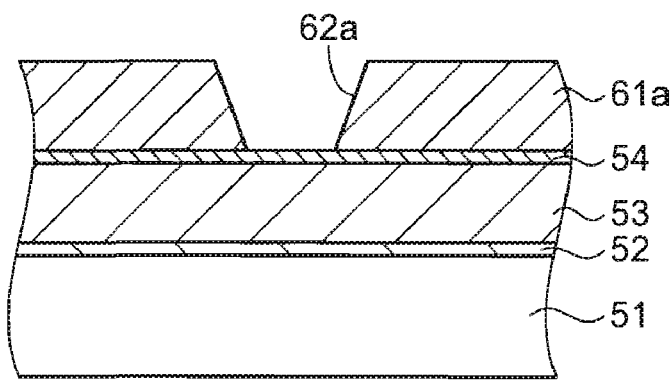
FIG. 4 is a sectional view schematically showing the method for manufacturing the semiconductor device.

In a step shown in FIG. 4 (first photoresist pattern forming step), a first photoresist pattern 61a is to be completed. First, the exposed photoresist film 22 is to be developed. The exposed area of the photoresist film 22 in a tapered shape melts by the developing. This completes the photoresist pattern 61a having the opening hole 62a in a tapered shape with the exposed side being wide. A thickness of the first photoresist pattern 61a is 1 µm, for example.

Figure 5:
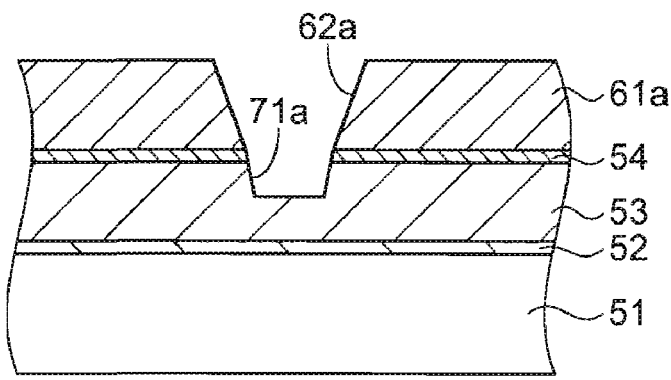
FIG. 5 is a sectional view schematically showing the method for manufacturing the semiconductor device.

In a step shown in FIG. 5 (first etching step), a first contact hole 71a is to be formed to the silicon oxide film 53. An etching treatment is performed to the titanium nitride film 54 and up to around a center of the silicon oxide film 53, using the photoresist pattern 61a having the opening hole 62a in a tapered shape as a mask. The etching treatment may be a dry etching, for example. The first contact hole 71a is formed by performing anisotropic etching. An etching gas is a fluorinated gas (such as CF4), for example.

When the first contact hole 71a is formed by etching, the first photoresist pattern 61a is also to be etched when the silicon oxide film 53 is being etched. More particularly, by retreating an edge of the opening hole 62a of the first photoresist pattern 61a, the silicon oxide film 53 is to be etched by gradually enlarging a size of the opening hole 62a. In other words, as the opening hole 62a is in a tapered shape with the exposed side being wide, the opening hole 62a can be enlarged while maintaining the tapered shape, by anisotropically etching the photoresist pattern 61a. The silicon oxide film 53 and the first photoresist pattern 61a may be etched at the same time by increasing percentage of oxygen (O₂) to the fluorinated (CF) etching gas. As above, the first contact hole 71a in a tapered shape with a wide opening is formed by etching the silicon oxide film 53 while enlarging the opening hole 62a of the first photoresist pattern 61a.

Figure 6:
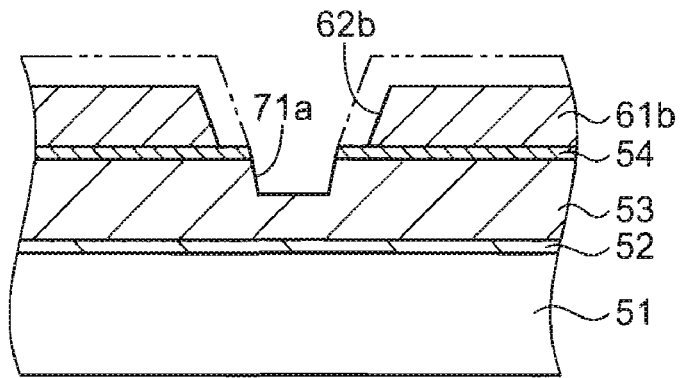
FIG. 6 is a sectional view schematically showing the method for manufacturing the semiconductor device.

In a step shown in FIG. 6 (second photoresist pattern forming step), a second photoresist pattern 61b is to be formed in order to form a two-stage contact hole 71 (see FIG. 7), by etching only the first photoresist pattern 61a. The etching gas is oxygen (O₂), for example. This enables to perform anisotropic etching only to the first photoresist pattern 61a, without etching the silicon oxide film 53. By anisotropically etching the first photoresist pattern 61a, a hole diameter of the opening hole 62a (see FIG. 5) can be enlarged to the hole diameter of the opening hole 62b. A thickness of the second photoresist pattern 61b formed as such is 0.6 μm, for example.

Figure 7:
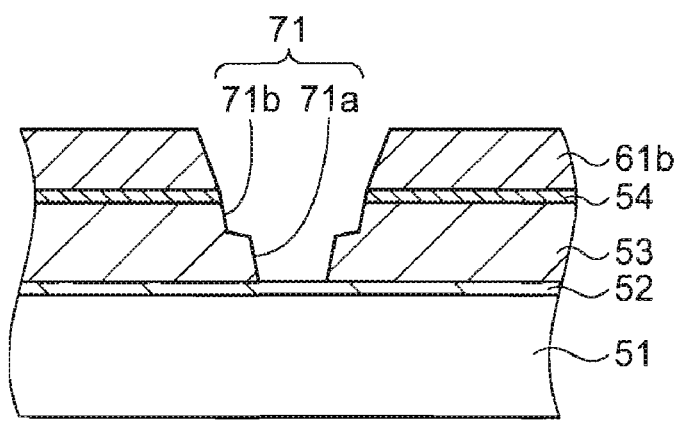
FIG. 7 is a sectional view schematically showing the method for manufacturing the semiconductor device.

In a step shown in FIG. 7 (second etching step), the two-stage contact hole 71 is to be completed by forming a second contact hole 71b to the silicon oxide film 53. More particularly, the silicon oxide film 53 is to be etched using the second photoresist pattern 61b as a mask. The etching gas is the fluorinated (CF) gas, for example, as in a case when the first contact hole 71a is formed. This allows to form the second contact hole 71b to the silicon oxide film 53, and the first contact hole 71a is continuously etched to a top surface of the polysilicon layer 52.

When the second contact hole 71b is formed by etching, the second photoresist pattern 61b is also to be etched when the silicon oxide film 53 is being etched. More particularly, as in a case when the above-described first contact hole 71a is formed, by retreating the edge of the opening hole 62b of the second photoresist pattern 61b by etching, the silicon oxide film 53 is etched by gradually enlarging a size of the opening hole 62b. The gas, which the percentage of oxygen (O₂) is increased to the fluorinated (CF) gas, is used as the etching gas. As above, the second contact hole 71b in a tapered shape with a wide opening is formed, by etching the silicon oxide film 53 while enlarging the opening hole 62b of the second photoresist pattern 61b.

As above, the two-stage contact hole 71, which the first contact hole 71a is formed in a tapered shape to the top surface of the polysilicon layer 52 and the second contact hole 71b is also formed in a tapered shape, is completed. By making the contact hole 71 into the two-stage hole, the aspect ratio of the contact hole 71 can be reduced. Further, by exposing the photoresist film 22 using the holographic exposure device 11, the microscopic opening hole 62a may be formed. This enables to form the microscopic contact hole 71 to the silicon oxide film 53. In addition, by performing the etching treatment only by the dry etching, the opening of the contact hole 71 may be enlarged in a stable shape with minimum variations.

Figure 8:
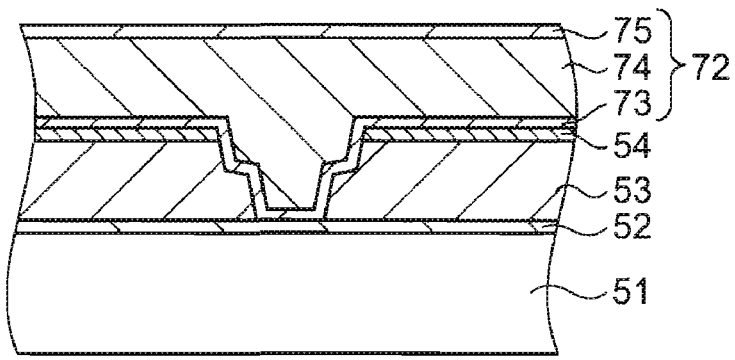
FIG. 8 is a sectional view schematically showing the method for manufacturing the semiconductor device.

In a step shown in FIG. 8 (filling step), a metal layer 72 as a metal film is formed on the silicon oxide film 53. First, the second photoresist pattern 61b on the titanium nitride film 54 (see FIG. 7) is to be removed. Next, the metal layer 72 is formed on the silicon oxide film 53 including the contact hole 71. The metal layer 72 is a metal such as tantalum and aluminum, for example. In the present embodiment, the metal layer 72 has a titanium (Ti) layer 73, an aluminum (Al) layer 74, and a titanium nitride (TiN) layer 75. A thickness of the titanium layer 73 is 50 nm, for example. A thickness of the aluminum layer 74 is 800 nm, for example. A thickness of the titanium nitride layer 75 is 50 nm, for example. The metal layer 72 is formed by depositing a metal material forming the metal layer 72 by a method such as the sputtering, for example.

By making the contact hole 71 to the two-stage, the aspect ratio of the contact hole 71 can be reduced when the metal layer 72 as above is filled in. And by forming the contact hole 71 in a tapered shape with a wide opening, the contact hole 71 can be filled with the metal material with ease. As a result, the coverage can be improved.

Figure 9:
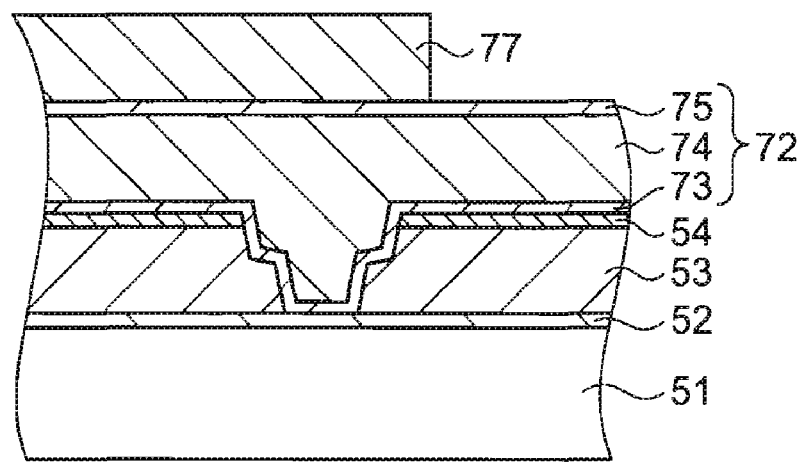
FIG. 9 is a sectional view schematically showing the method for manufacturing the semiconductor device.

In a step shown in FIG. 9, a photoresist pattern 77 for forming a wiring layer 81 (see FIG. 10) is to be formed. First, a photoresist film is formed on the metal layer 72. Next, using a photolithography technology, the photoresist film is exposed and developed. This completes the photoresist pattern 77 for forming the wiring layer 81.

Figure 10:
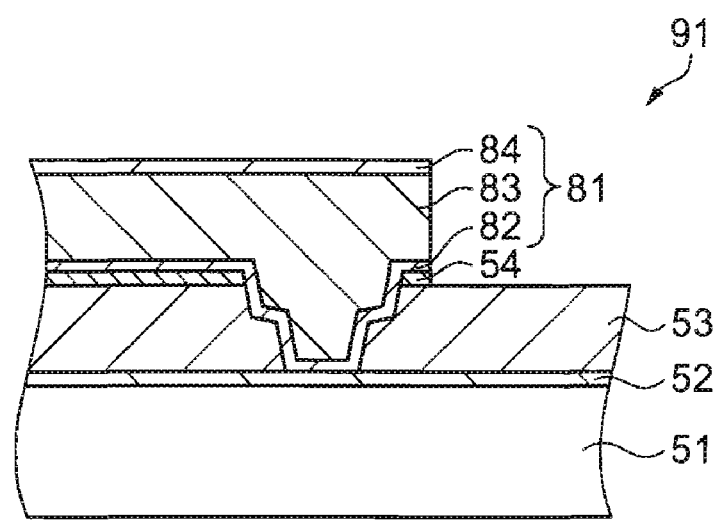
FIG. 10 is a sectional view schematically showing the method for manufacturing the semiconductor device.

In a step shown in FIG. 10, the wiring layer 81 is to be formed by etching the metal layer 72. First, the metal layer 72 is to be etched using the photoresist pattern 77 formed in the previous step, as a mask. The titanium nitride film 54 formed in an unnecessary area is also to be removed with the etching of the wiring layer 81. The etching treatment is performed by the dry etching, for example. Then the photoresist pattern 77 on the wiring layer 81 is to be removed. As a result, a semiconductor device 91 having a titanium layer 82, an aluminum layer 83 and a titanium nitride layer 84, formed with the wiring layer 81 having a desired pattern can be obtained.

The method for manufacturing the semiconductor device and the semiconductor device of the present embodiment, for example, may be applicable for forming a pixel circuit which constitutes each pixel of an electro-optical device, such as an electroluminescent (EL) display and a liquid crystal display, and a driver (integrated circuit) for controlling the pixel circuit. Other than manufacturing these electro-optical devices, it may also be applicable to manufacturing various devices. For example, manufacturing of various memories such as a ferroelectric random access memory (FeRAM), a static RAM (SRAM), a dynamic RAM (DRAM), an NOR RAM, an NAND RAM, a floating gate nonvolatile memory and a magnetic RAM (MRAM) are possible. It may also be utilized to an integrated sensor using a thin film transistor, a bank card mounted with a central processing unit (CPU) and the like. Further, the method is applicable to a contactless communication system using microwaves, when inexpensive tags mounted with micro circuit chips (IC chip) are to be manufactured.

As described in detail, according to the embodiment of the method for manufacturing the semiconductor device and the semiconductor device, following advantages can be obtained.

(1) According to the embodiment, by exposing and developing the photoresist film 22 of the novolac resin system having the photosensitive characteristic of low transmittance (low-contrast), the first photoresist pattern 61a having the opening hole 62a in a tapered shape with the exposed side being wide can be formed. By anisotropically etching the silicon oxide film 53 using the first photoresist pattern 61a as a mask, and also etching the first photoresist pattern 61a anisotropically, the first contact hole 71a can be formed by enlarging the opening hole 62a. This enables to form the first contact hole 71a in a tapered shape with a wide opening. Further, the opening hole 62b is formed in a large size by performing anisotropic etching only to the first photoresist pattern 61a. Then, in the same way, the two-stage contact hole 71 with a wide opening can be formed by performing anisotropic etching, using the second photoresist pattern 61b as a mask. As the aspect ratio of the contact hole 71 can be reduced, and the opening is in a wide tapered shape, the entire contact hole 71 can be filled with the metal layer 72. In addition, by performing the etching treatment only with the dry etching, the opening of the contact hole 71 can be enlarged to a stable shape with minimum variations. As a result, the coverage of the contact hole 71 can be improved, enabling to obtain stable electrical characteristics.

(2) According to the embodiment, by exposing the photoresist film 22 using the holographic exposure device 11, the microscopic opening hole 62*a* may be formed to the photoresist film 22 even the substrate 51 is large in size. Therefore, even the substrate 51 is large in size, the microscopic contact hole 71 may be formed using the first photoresist pattern 61*a* as a mask.

The embodiment is not limited to the above and the following modifications may apply.

(Modification 1) In the above, the step of forming the contact hole 71 is used as an example. However, the invention is applicable to forming a via-hole as one of the concaves, forming a wiring groove as a groove, or the like.

(Modification 2) The contact hole 71 is not limited to having both the first contact hole 71*a* and the second contact hole 71*b* formed in tapered shapes, as above. For example, it may be formed so that only the second contact hole 71*b* is in a tapered shape. Also, the contact hole 71 is not limited to be formed in a two-stage. It may be formed in a single-stage contact hole in a tapered shape, for example.

The entire disclosure of Japanese Patent Application No: 2006-084936, filed Mar. 27, 2006 is expressly incorporated by reference herein.

What is claimed is:

1. A method of manufacturing a semiconductor device, comprising:
    forming a first photosensitive material having a first opening hole, the first photosensitive material being positioned over a first work target layer, the first work target layer being positioned over a substrate;
    forming a second work target layer having a first concave portion having a first depth by performing a first etching treatment to the first work target layer using the first photosensitive material as a mask;
    forming a second photosensitive material having a second opening hole by enlarging the first opening hole of the first photosensitive material; and
    forming a third work target layer having a second concave portion having a second depth by performing a second etching treatment to the second work target layer using the second photosensitive material as a mask, the second concave portion having a first part and a second part, the first part being interposed between the second part and the substrate, the second depth being larger than the first depth, the second depth being equal or larger than a thickness of the first work target layer.

2. The method of manufacturing the semiconductor device according to claim 1, the first opening hole having a tapered shape after the process of forming the first photosensitive material, the first concave portion having a tapered shape after the process of forming the second work target layer.

3. The method of manufacturing the semiconductor device according to claim 1, the second opening hole having a tapered shape after the process of forming the second photosensitive material, the second concave portion having a tapered shape after the process of forming the third work target layer.

4. The method of manufacturing the semiconductor device according to claim 1, the first opening hole being formed by using a holographic exposure device in the process of forming the first photosensitive material.

5. The method of manufacturing the semiconductor device according to claim 1, the first opening hole being formed by using a holographic exposure device in the process of forming the first photosensitive material, the first photosensitive material including a low transmittance material.

6. The method of manufacturing the semiconductor device according to claim 1, the first opening hole being formed by exposing the first photosensitive material, the first opening hole having a tapered shape with the exposed side being wide.

7. The method of manufacturing the semiconductor device according to claim 1, the second concave portion being one of a contact hole and a via-hole.

8. The method of manufacturing the semiconductor device according to claim 1, further comprising:
    forming a metal film at least on a surface of the first part and a surface of the second part.

9. A method of manufacturing a semiconductor device, comprising:
    forming a first photosensitive material having a first opening hole, the first photosensitive material being positioned over a first work target layer, the first work target layer being positioned over a substrate;
    forming a second work target layer having a first groove portion having a first depth by performing a first etching treatment to the first work target layer using the first photosensitive material as a mask;
    forming a second photosensitive material having a second opening hole by enlarging the first opening hole of the first photosensitive material; and
    forming a third work target layer having a second groove portion having a second depth by performing a second etching treatment to the second work target layer using the second photosensitive material as a mask, the second groove portion having a first part and a second part, the first part being interposed between the second part and the substrate, the second depth being larger than the first depth, the second depth being equal or larger than a thickness of the first work target layer.

10. The method of manufacturing the semiconductor device according to claim 9, further comprising:
    forming a metal film at least on a surface of the first part and a surface of the second part.

11. A semiconductor device, comprising:
    a substrate;
    a work target layer positioned over the substrate; and
    a metal,
    the work target layer having a concave portion, the concave portion having a first part and a second part, the first part being interposed between the second part and the substrate,
    the concave portion being projected to one surface of the substrate, an area of the first part being included in an area of the second part, and
    the metal being disposed in the first part and the second part.

* * * * *